(12) United States Patent
Basker et al.

(10) Patent No.: US 9,324,870 B2
(45) Date of Patent: Apr. 26, 2016

(54) FIN FIELD EFFECT TRANSISTOR INCLUDING ASYMMETRIC RAISED ACTIVE REGIONS

(71) Applicant: GLOBALFOUNDRIES INC., Grand Cayman (KY)

(72) Inventors: Veeraraghavan S. Basker, Schenectady, NY (US); Kangguo Cheng, Schenectady, NY (US); Ali Khakifirooz, Mountain View, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/020,923

(22) Filed: Sep. 9, 2013

(65) Prior Publication Data

US 2015/0069526 A1    Mar. 12, 2015

(51) Int. Cl.
| | | |
|---|---|---|
| H01L 29/66 | (2006.01) | |
| H01L 29/78 | (2006.01) | |
| H01L 21/84 | (2006.01) | |
| H01L 29/417 | (2006.01) | |
| H01L 27/12 | (2006.01) | |

(52) U.S. Cl.
CPC .......... *H01L 29/7856* (2013.01); *H01L 21/845* (2013.01); *H01L 27/1211* (2013.01); *H01L 29/41791* (2013.01); *H01L 29/66795* (2013.01); *H01L 29/785* (2013.01)

(58) Field of Classification Search
CPC ...................... H01L 29/7856; H01L 29/66795
USPC .......................................................... 257/192
See application file for complete search history.

(56) References Cited

U.S. PATENT DOCUMENTS

2013/0214357 A1 *   8/2013   Chang et al. ................. 257/347

* cited by examiner

*Primary Examiner* — Ajay K Arora
(74) *Attorney, Agent, or Firm* — Scully, Scott, Murphy & Presser, P.C.

(57) ABSTRACT

Merged and unmerged raised active regions on semiconductor fins can be simultaneously formed on a same substrate by control of growth rates of a deposited semiconductor material on surfaces of the semiconductor fins. In one embodiment, a growth-rate-retarding dopant can be implanted by angled ion implantation onto sidewall surfaces of first semiconductor fins on which retardation of growth rates is desired, while second semiconductor fins are masked by a masking layer. In another embodiment, a growth-rate-enhancing dopant can be implanted by ion implantation onto sidewall surfaces of second semiconductor fins, while first semiconductor fins are masked by a masking layer. The differential growth rates of the deposited semiconductor material can cause raised active regions on the first semiconductor fins to remain unmerged, and raised active regions on the second semiconductor fins to become merged.

12 Claims, 12 Drawing Sheets

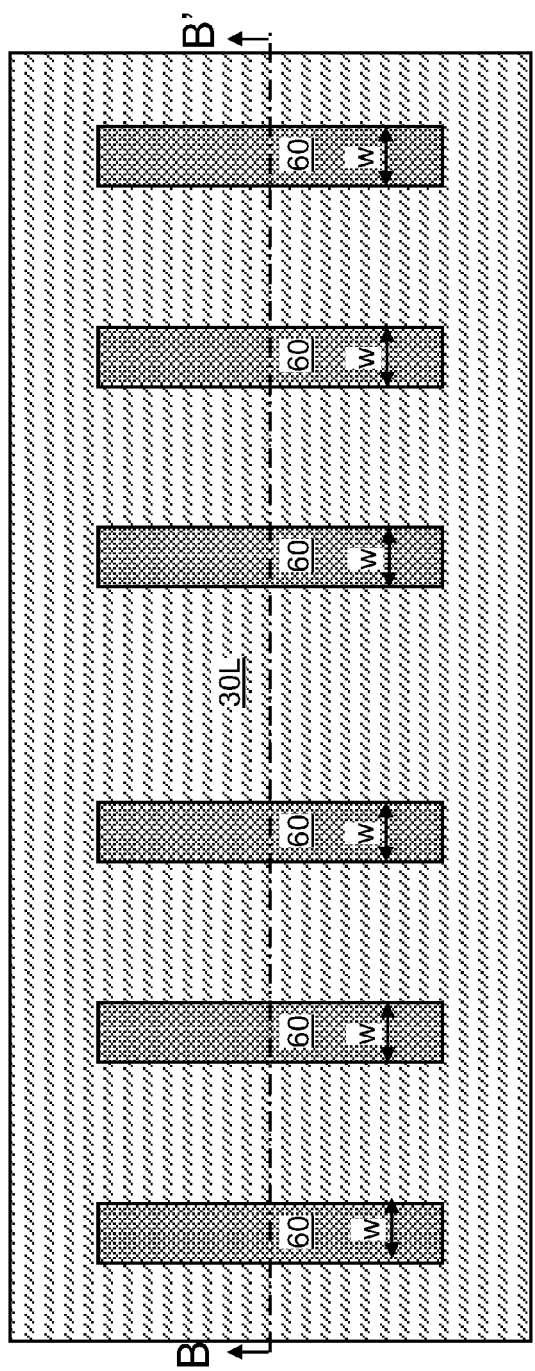
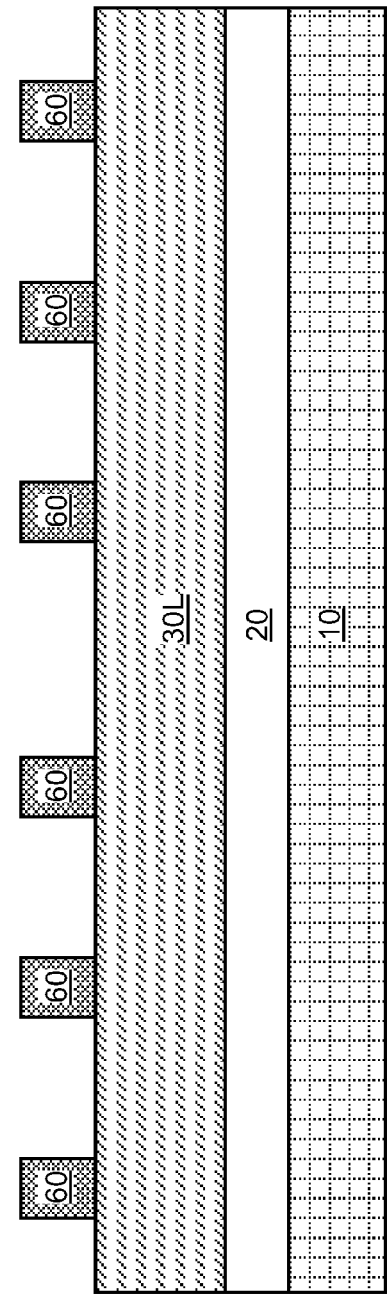

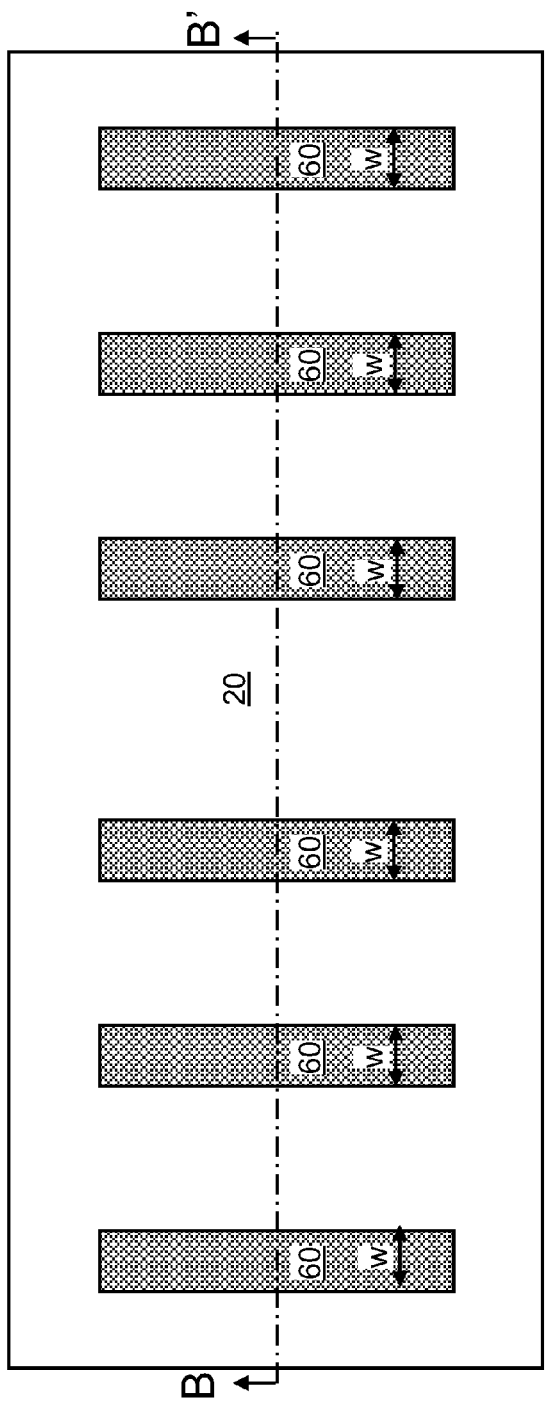
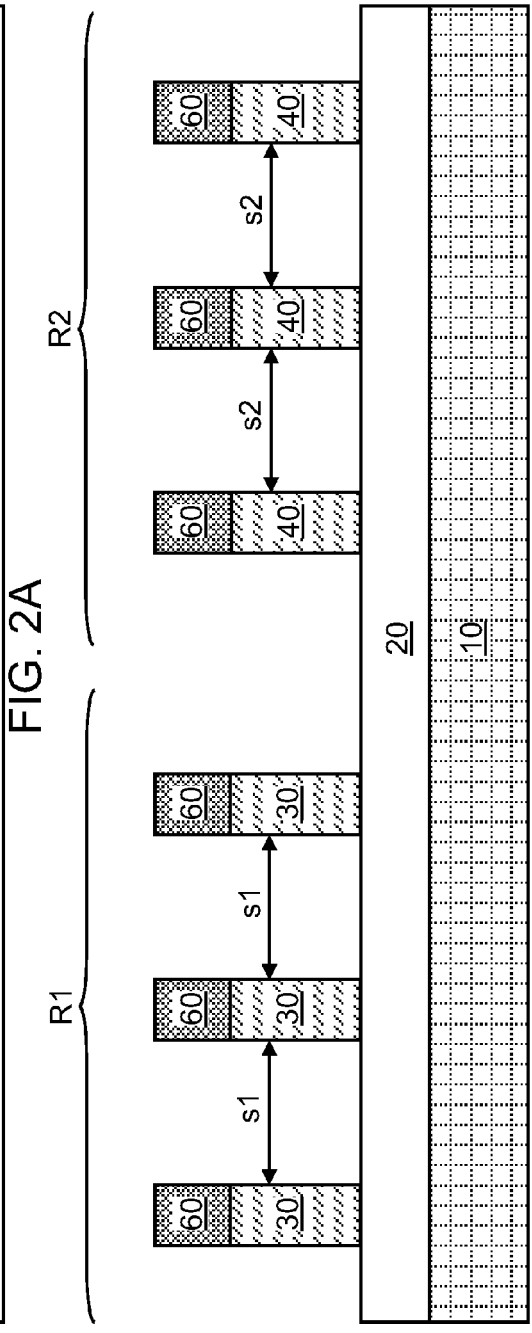

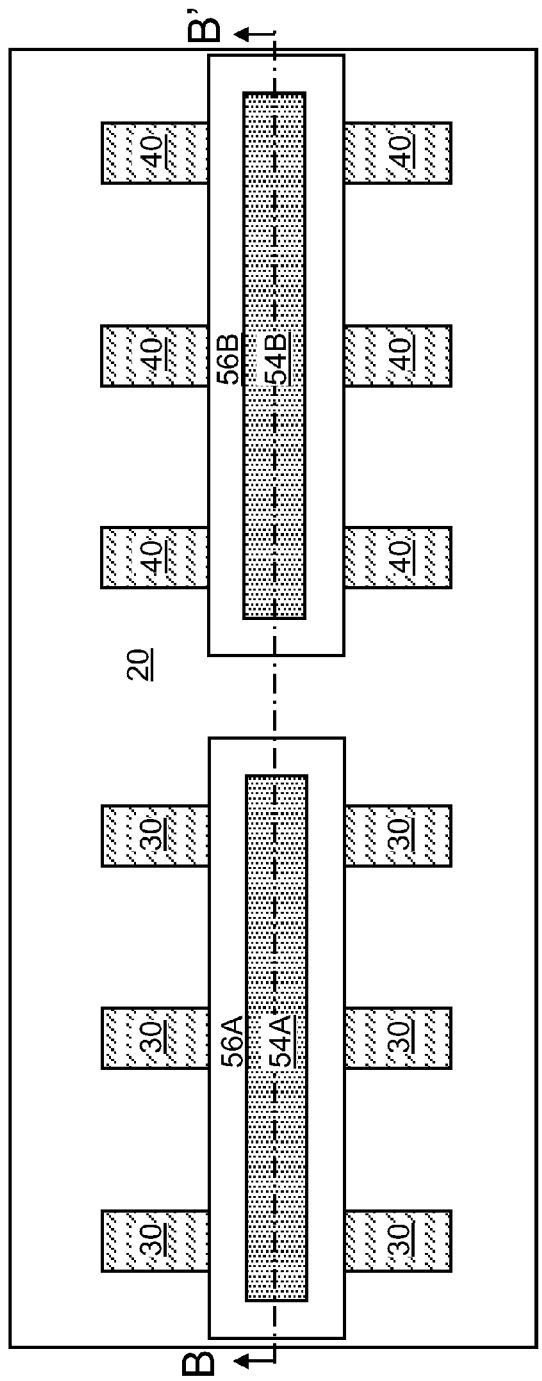
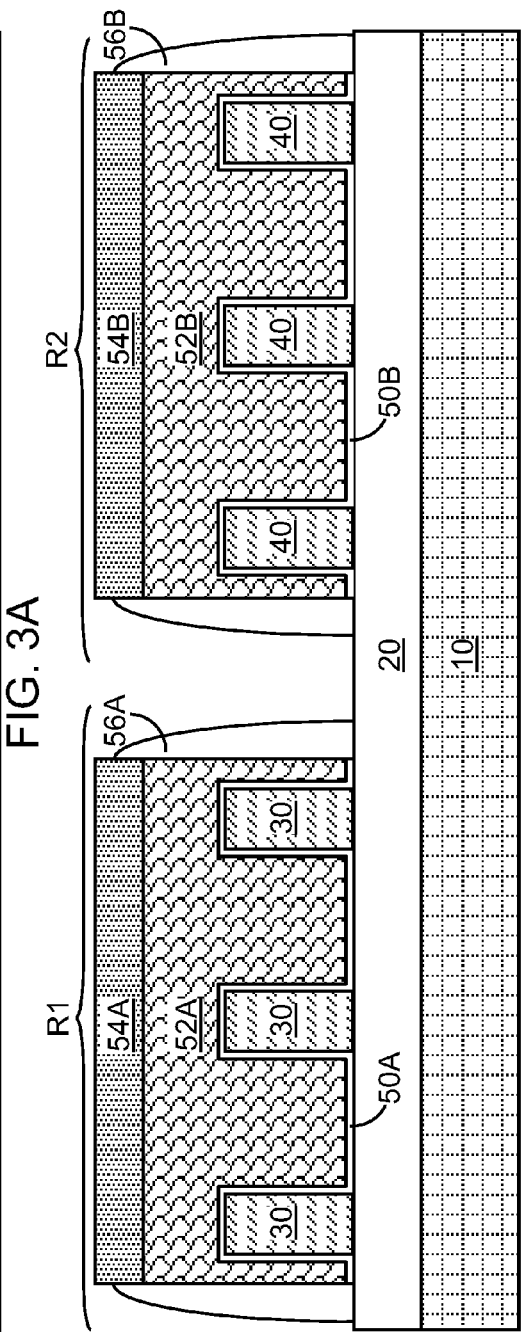
FIG. 3A
FIG. 3B

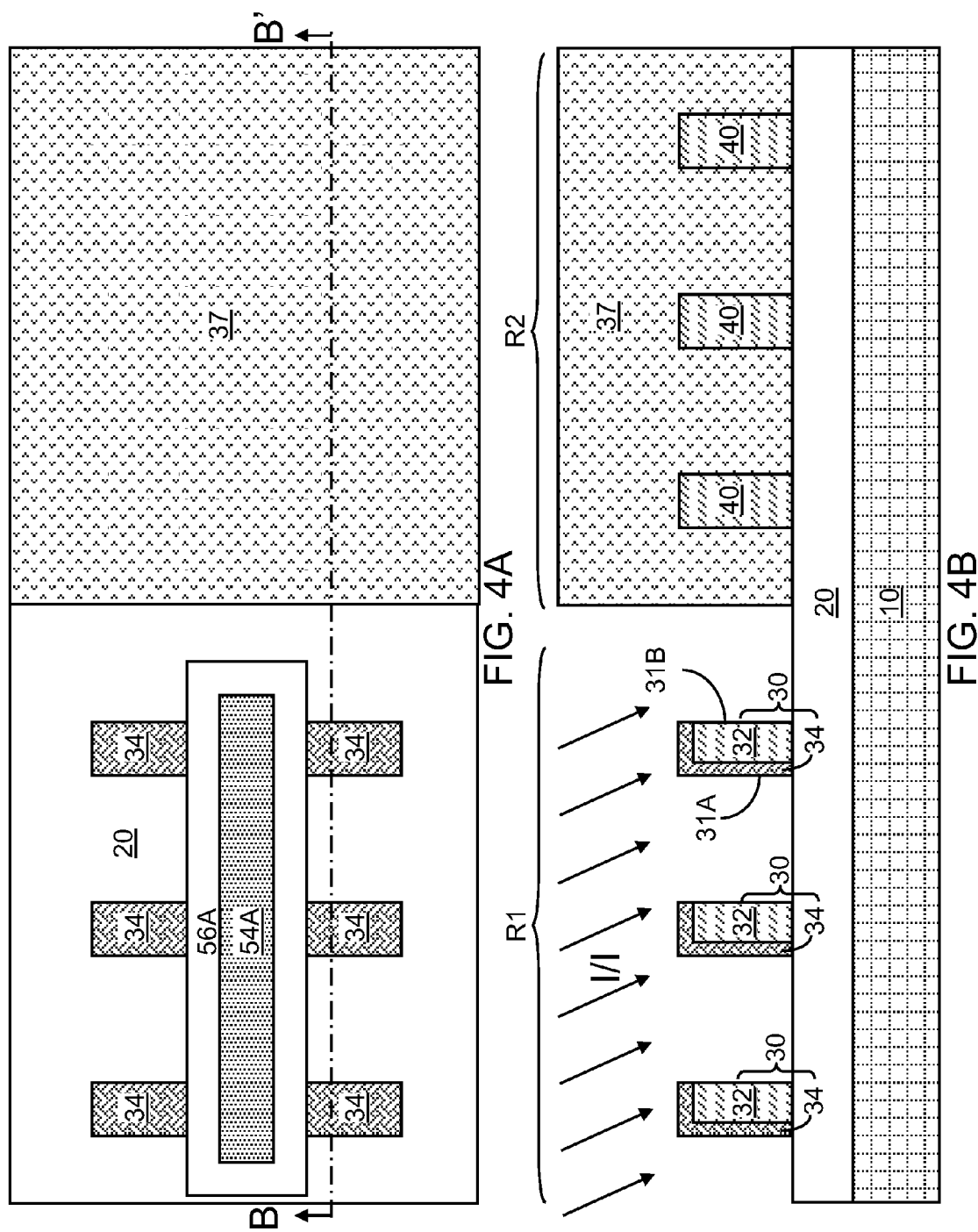

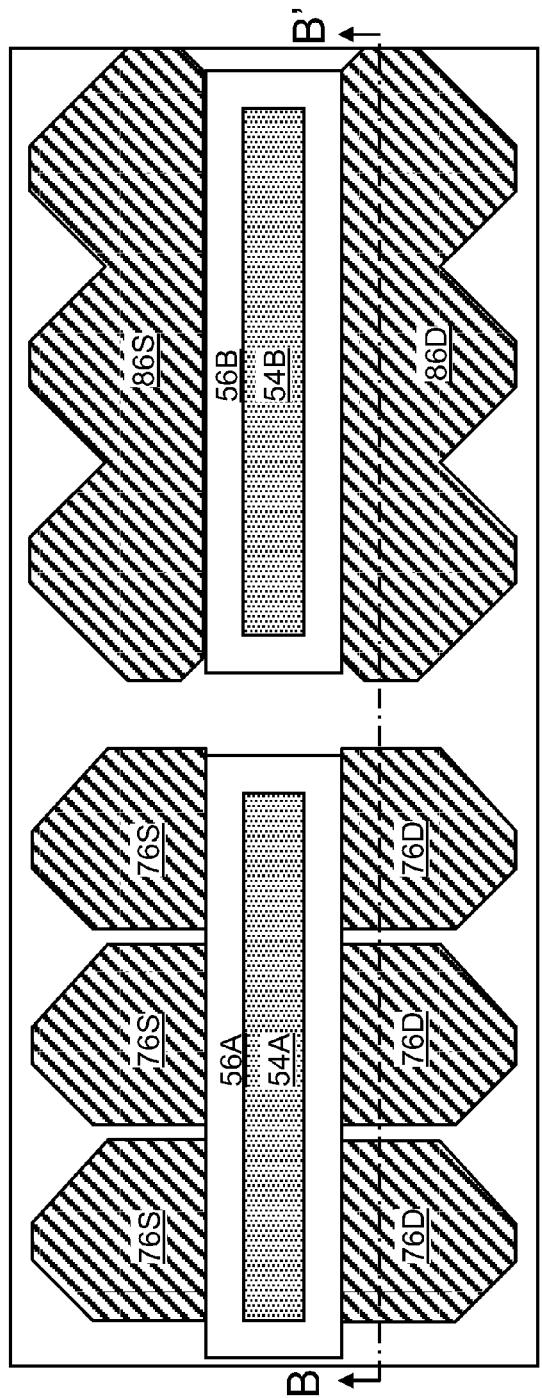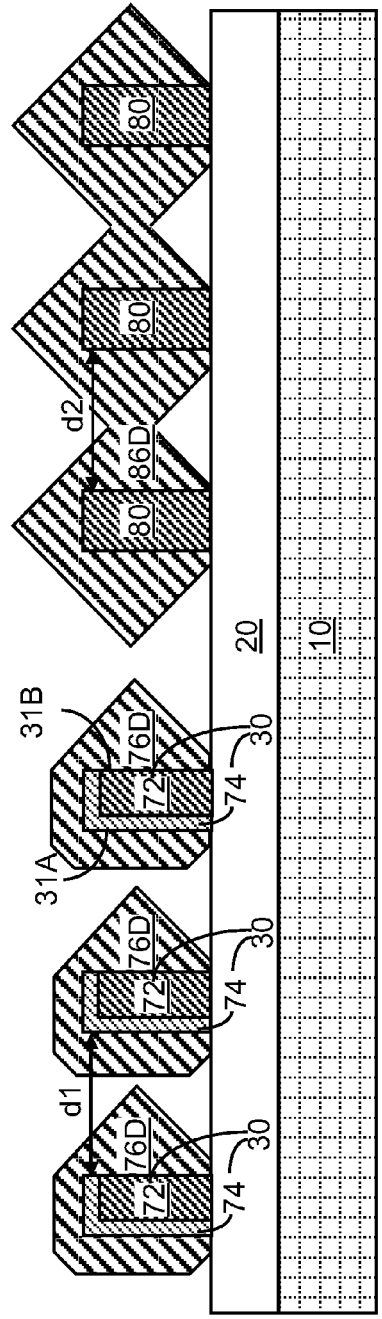
FIG. 5A
FIG. 5B

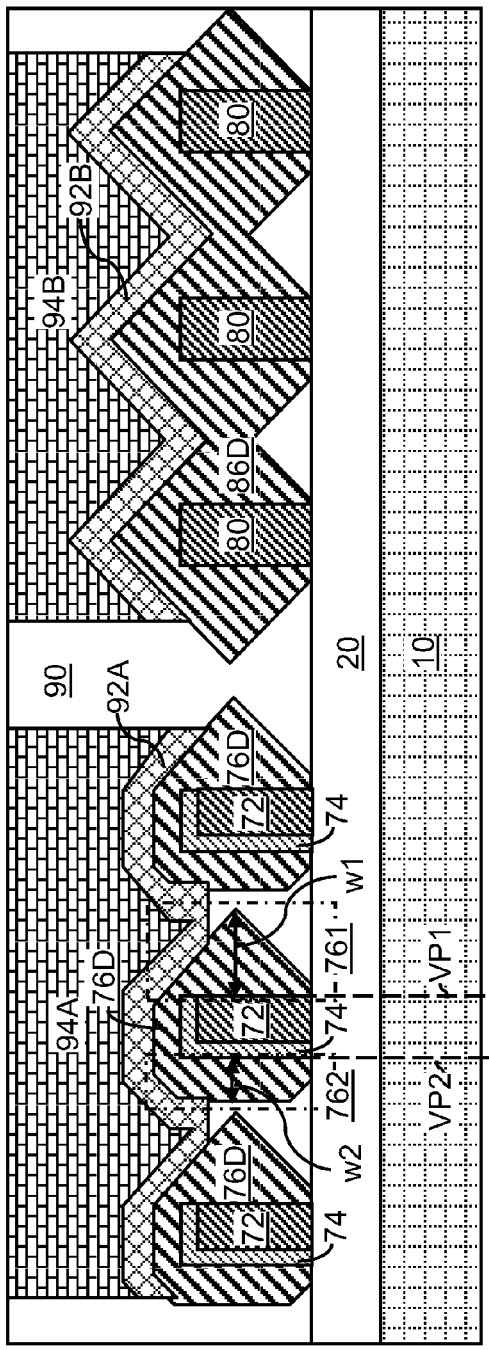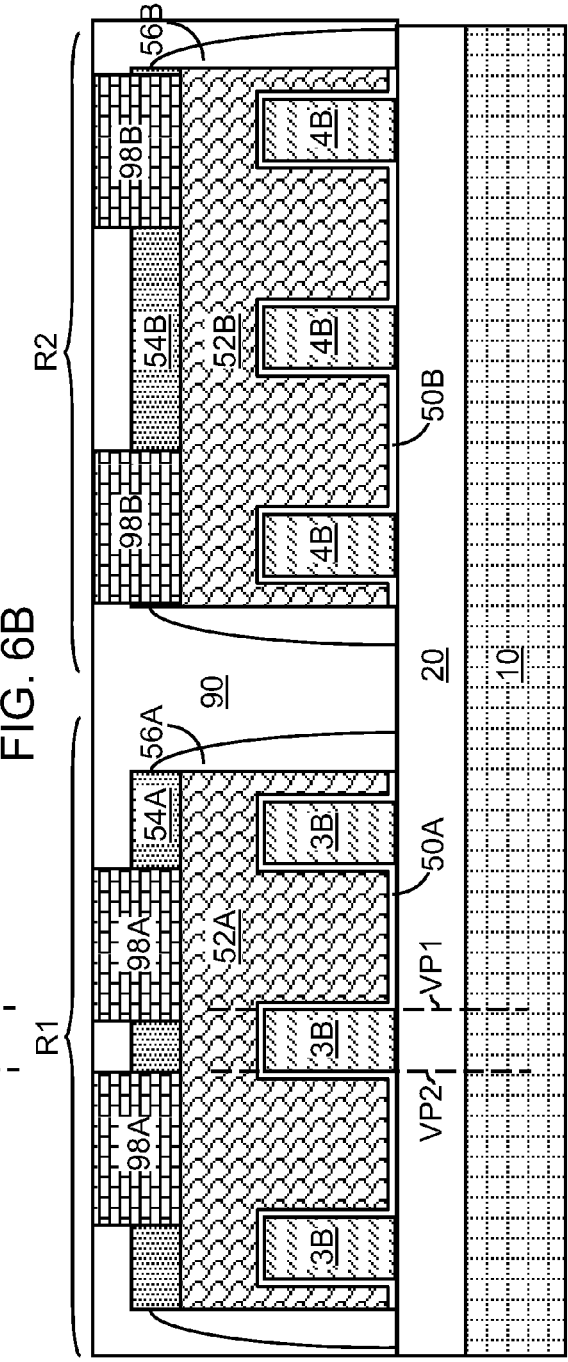
FIG. 6B
FIG. 6C

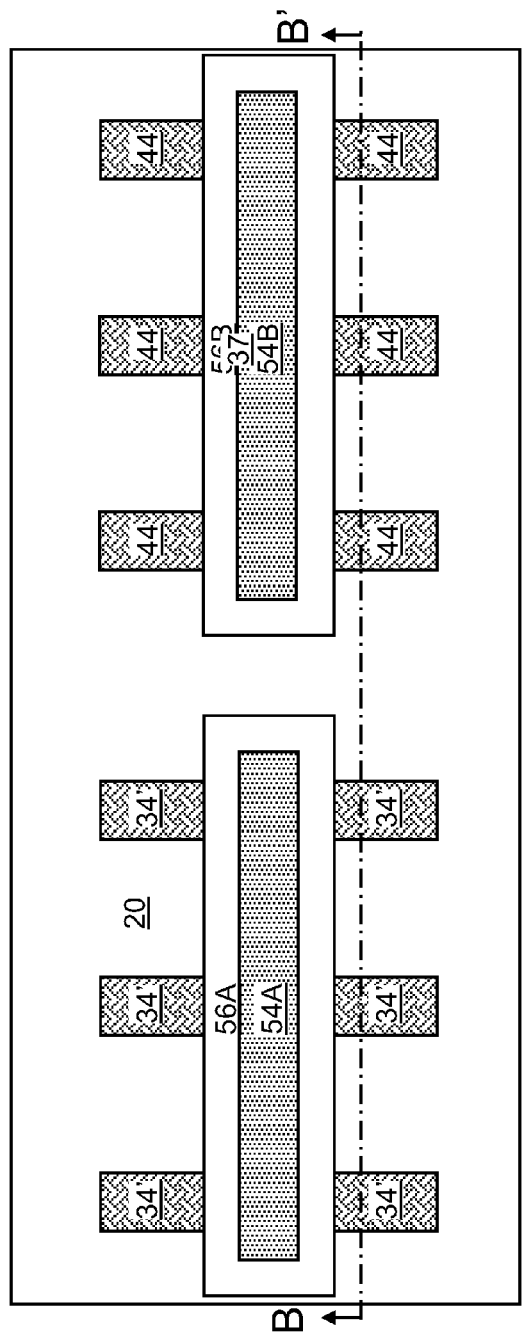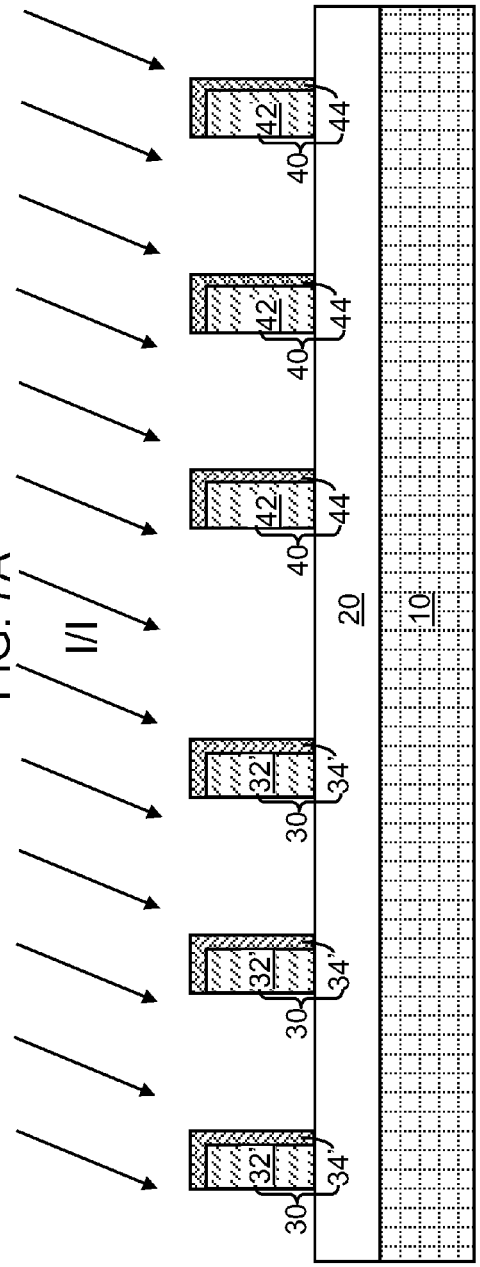

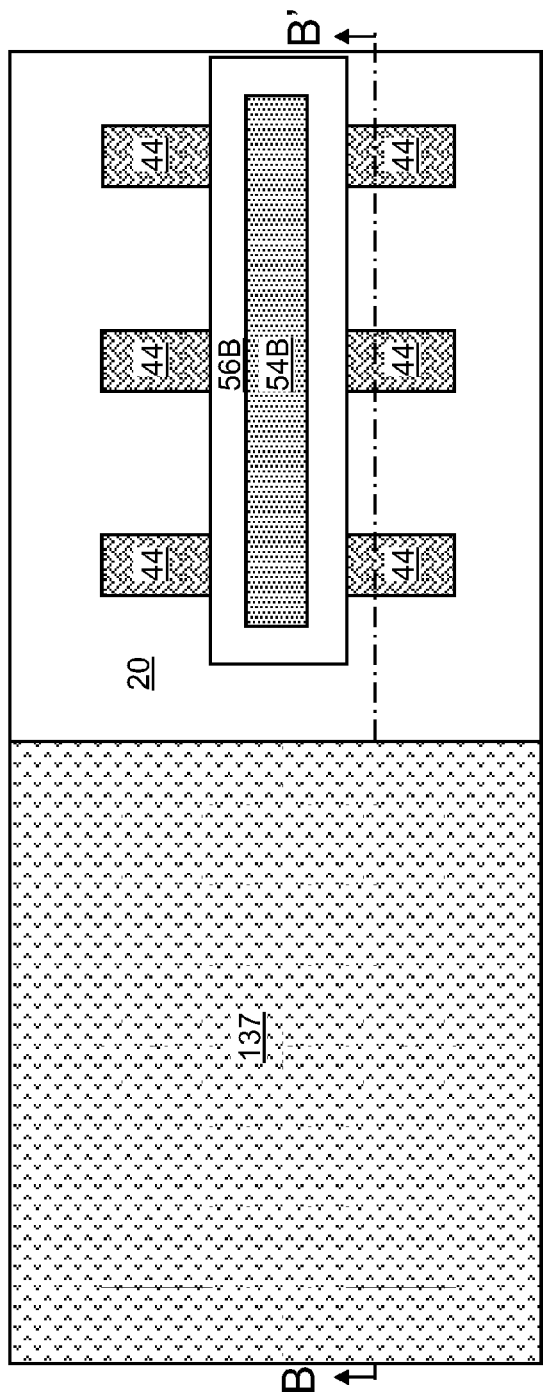
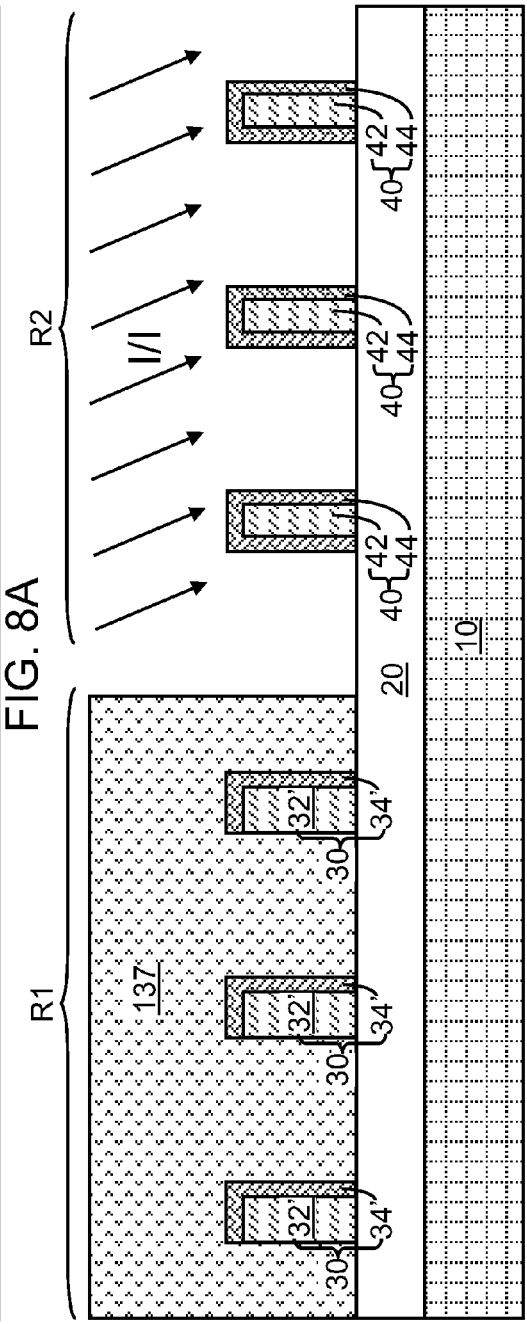
FIG. 8A
FIG. 8B

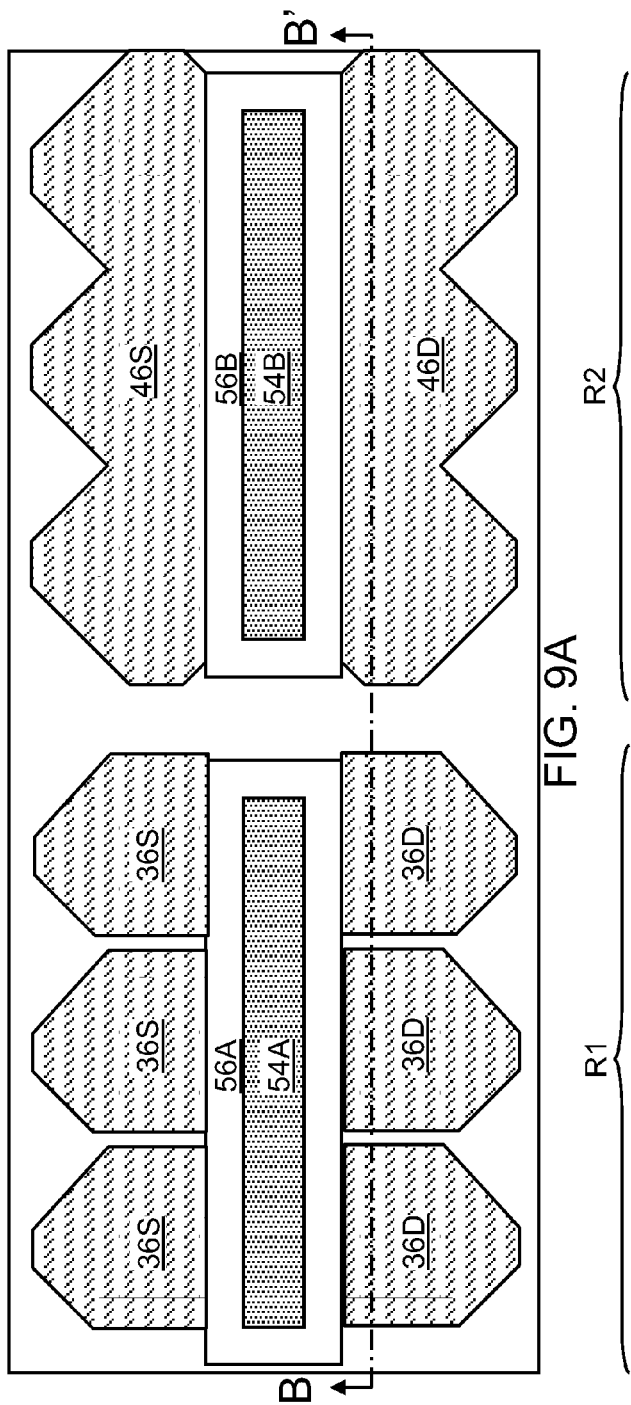
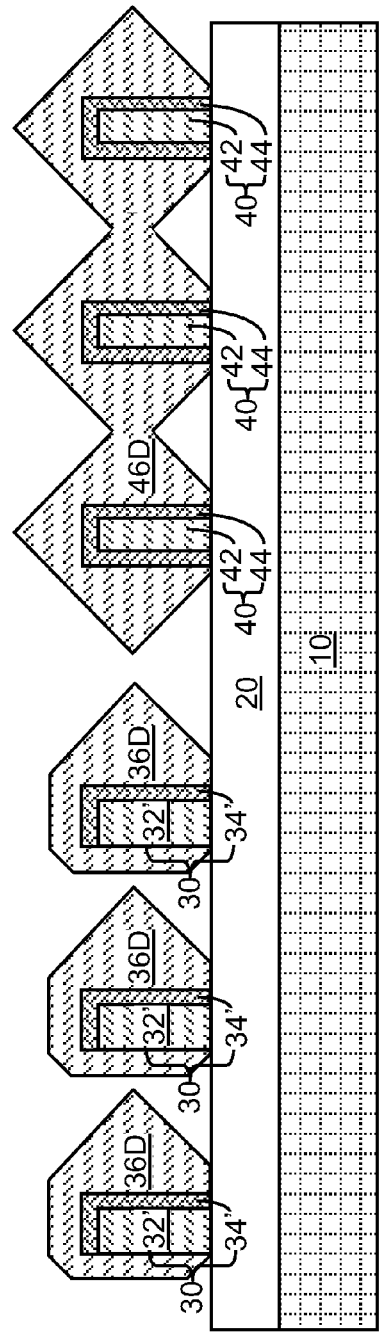
FIG. 9A
FIG. 9B

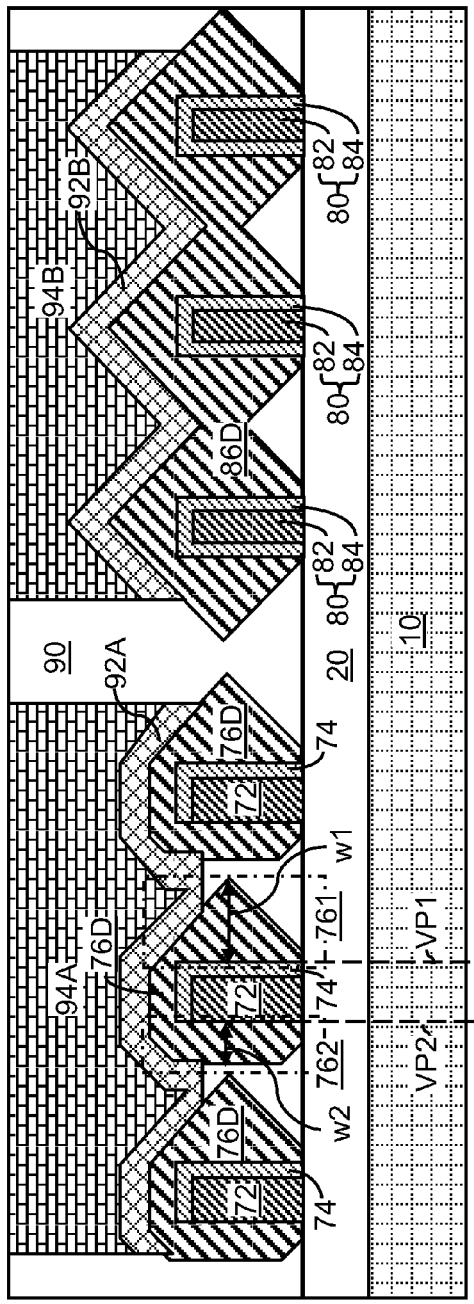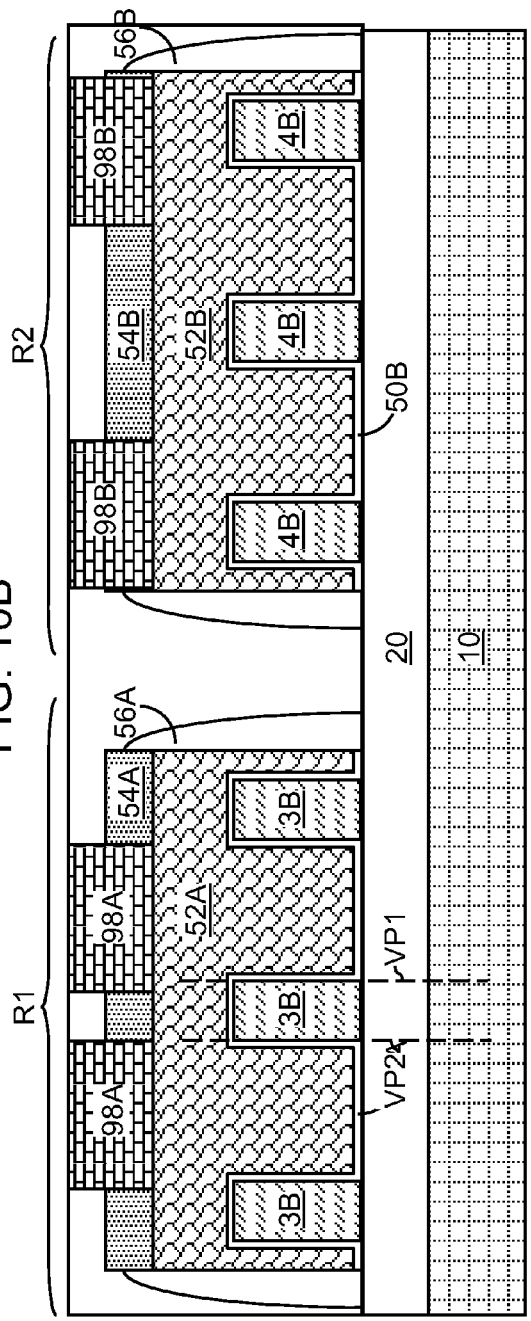

FIN FIELD EFFECT TRANSISTOR INCLUDING ASYMMETRIC RAISED ACTIVE REGIONS

BACKGROUND

The present disclosure relates to a semiconductor structure, and more particularly to a fin field effect transistor including asymmetric raised active regions, and a method of manufacturing the same.

One of the key design choices among fin field effect transistors is whether raised active regions formed by selective epitaxy are to be merged with one another or to remain unmerged. Each choice offers advantages and disadvantages. On one hand, fin field effect transistors including unmerged raised active regions benefit from lower contact resistance and improved direct current (DC) performance due to increased silicide contact areas corresponding to wrapping around of the silicides around the faceted surfaces of the unmerged raised active regions. On the other hand, fin field effect transistors including merged raised active regions benefit from reduced parasitic resistance between a gate electrode and contact via structures due to the reduction in the number of contact via structures. For this reason, it is desirable to have merged raised active regions for some fin field effect transistors, and to have unmerged raised active regions for some other fin field effect transistors.

SUMMARY

Merged and unmerged raised active regions on semiconductor fins can be simultaneously formed on a same substrate by control of growth rates of a deposited semiconductor material on surfaces of the semiconductor fins. In one embodiment, a growth-rate-retarding dopant can be implanted by angled ion implantation onto sidewall surfaces of first semiconductor fins on which retardation of growth rates is desired, while second semiconductor fins are masked by a masking layer. In another embodiment, a growth-rate-enhancing dopant can be implanted by ion implantation onto sidewall surfaces of second semiconductor fins, while first semiconductor fins are masked by a masking layer. The differential growth rates of the deposited semiconductor material can cause raised active regions on the first semiconductor fins to remain unmerged, and raised active regions on the second semiconductor fins to become merged.

According to an aspect of the present disclosure, a semiconductor structure is provided, which includes a semiconductor fin located on a substrate and having a first sidewall contained within a first vertical plane and a second sidewall contained within a second vertical plane that is parallel to the first vertical plane. The semiconductor structure further includes a raised active region including a semiconductor material and having an asymmetric vertical cross-sectional shape along a vertical plane perpendicular to the first and second vertical planes.

According to another aspect of the present disclosure, a method of forming a semiconductor structure is provided. A semiconductor fin including a first sidewall and a second sidewall that are parallel to each other is formed on a substrate. A species of dopants is implanted into the first sidewall while preventing implantation of dopants into a lower portion of the second sidewall. A semiconductor material is deposited on the first and second sidewalls. The semiconductor material is deposited with different growth rates between the first and second sidewalls due to presence or absence of the species of dopants.

BRIEF DESCRIPTION OF SEVERAL VIEWS OF THE DRAWINGS

FIG. 1A is a top-down view of a first exemplary semiconductor structure after formation of fin-defining mask structures according to a first embodiment of the present disclosure.

FIG. 1B is a vertical cross-sectional view of the first exemplary semiconductor structure along the vertical plane B-B' of FIG. 1A.

FIG. 2A is a top-down view of the first exemplary semiconductor structure after formation of semiconductor fins according to the first embodiment of the present disclosure.

FIG. 2B is a vertical cross-sectional view of the first exemplary semiconductor structure along the vertical plane B-B' of FIG. 2A.

FIG. 3A is a top-down view of the first exemplary semiconductor structure after formation of gate stacks and gate spacers according to the first embodiment of the present disclosure.

FIG. 3B is a vertical cross-sectional view of the first exemplary semiconductor structure along the vertical plane B-B' of FIG. 3A.

FIG. 4A is a top-down view of the first exemplary semiconductor structure during angled implantation of dopant atoms employing a masking layer according to the first embodiment of the present disclosure.

FIG. 4B is a vertical cross-sectional view of the first exemplary semiconductor structure along the vertical plane B-B' of FIG. 4A.

FIG. 5A is a top-down view of the first exemplary semiconductor structure after formation of various raised active regions according to the first embodiment of the present disclosure.

FIG. 5B is a vertical cross-sectional view of the first exemplary semiconductor structure along the vertical plane B-B' of FIG. 5A.

FIG. 6B is a vertical cross-sectional view of the first exemplary semiconductor structure along the vertical plane B-B' of FIG. 6A.

FIG. 6C is a vertical cross-sectional view of the first exemplary semiconductor structure along the vertical plane C-C' of FIG. 6A.

FIG. 7A is a top-down view of a second exemplary semiconductor structure after a first angled ion implantation according to a second embodiment of the present disclosure.

FIG. 7B is a vertical cross-sectional view of the second exemplary semiconductor structure along the vertical plane B-B' of FIG. 7A.

FIG. 8A is a top-down view of the second exemplary semiconductor structure after a second angled ion implantation employing a masking layer according to the second embodiment of the present disclosure.

FIG. 8B is a vertical cross-sectional view of the second exemplary semiconductor structure along the vertical plane B-B' of FIG. 8A.

FIG. 9A is a top-down view of the second exemplary semiconductor structure after formation of various raised semiconductor regions according to the second embodiment of the present disclosure.

FIG. 9B is a vertical cross-sectional view of the second exemplary semiconductor structure along the vertical plane B-B' of FIG. 9A.

FIG. 10B is a vertical cross-sectional view of the second exemplary semiconductor structure along the vertical plane B-B' of FIG. 10A.

FIG. 10C is a vertical cross-sectional view of the second exemplary semiconductor structure along the vertical plane C-C' of FIG. 10A.

DETAILED DESCRIPTION

Figure 6A:
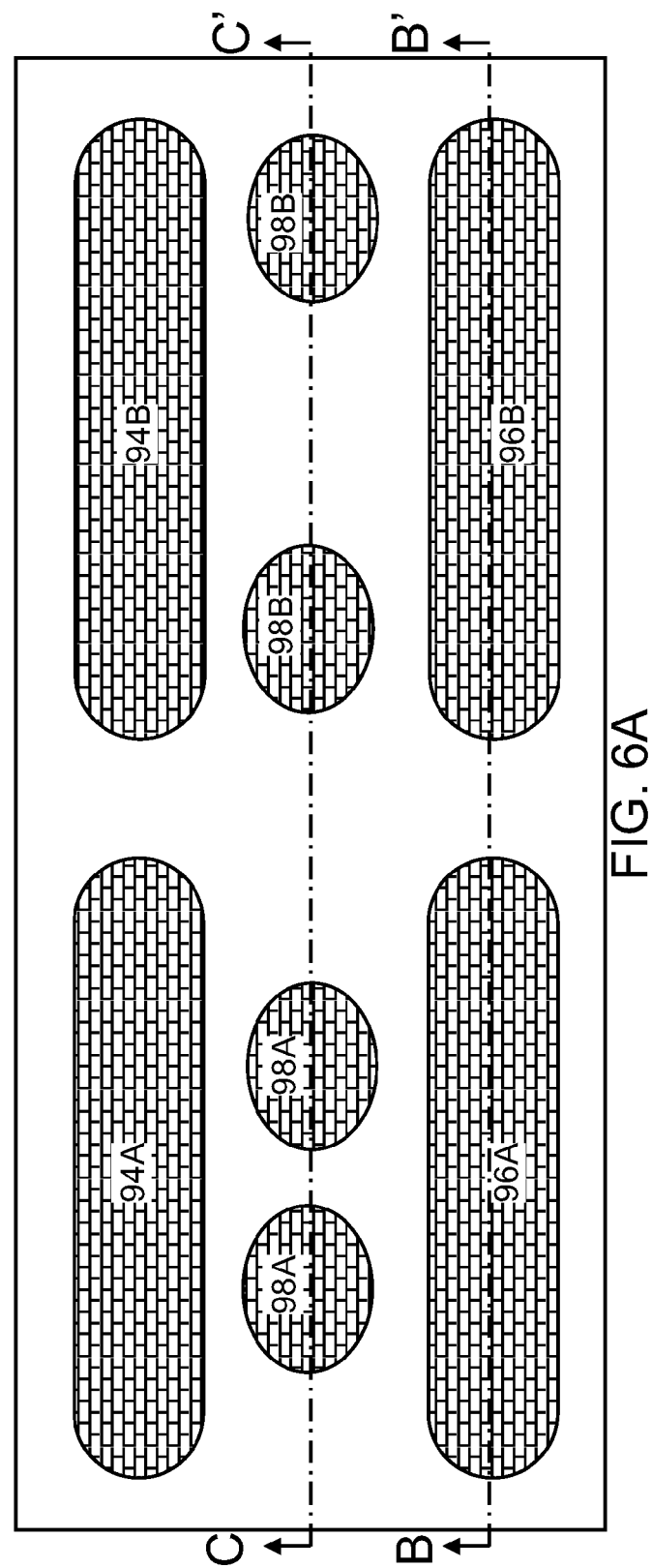
FIG. 6A is a top-down view of the first exemplary semiconductor structure after formation of a contact level dielectric layer and various contact via structures according to the first embodiment of the present disclosure.

As stated above, the present disclosure relates to a fin field effect transistor including asymmetric raised active regions, and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A and 1B, a first exemplary semiconductor structure according to a first embodiment of the present disclosure can be formed by providing a semiconductor-on-insulator (SOI) substrate. The SOI substrate can include a vertical stack, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 includes a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L includes a first semiconductor material. The top semiconductor layer 30L can be a single crystalline semiconductor material layer including the first semiconductor material. The first semiconductor material can be an elemental semiconductor material or a compound semiconductor material. For example, the first semiconductor material can be silicon, germanium, a silicon-germanium alloy, or a silicon-carbon alloy. The first semiconductor material may, or may not, be doped with p-type dopants and/or n-type dopants. The entirety of the top semiconductor layer 30L can be single crystalline. In one embodiment, the first semiconductor material can be an elemental single crystalline semiconductor material. In one embodiment, the first semiconductor material can be single crystalline silicon. The thickness of the top semiconductor layer 30L can be from 10 nm to 500 nm, although lesser and greater thicknesses can also be employed.

A plurality of fin-defining mask structures 60 is formed over the semiconductor layer 30L. The plurality of fin-defining mask structures 60 is a set of mask structures that cover the regions of the semiconductor layer 30L that are subsequently converted into semiconductor fins. Thus, the plurality of fin-defining mask structures 60 is subsequently employed to define the area of the semiconductor fins. The plurality of fin-defining mask structures 60 can include a dielectric material such as silicon nitride, silicon oxide, and silicon oxynitride. In one embodiment, the plurality of fin-defining mask structures 60 can includes a material selected from an undoped silicate glass (USG), a fluorosilicate glass (FSG), a phosphosilicate glass (PSG), a borosilicate glass (BSG), and a borophosphosilicate glass (BPSG).

The plurality of fin-defining mask structures 60 can be formed, for example, by depositing a planar dielectric material layer and lithographically patterning the dielectric material layer. The planar dielectric material layer can be deposited, for example, by chemical vapor deposition (CVD). The thickness of the planar dielectric material layer can be from 5 nm to 100 nm, although lesser and greater thicknesses can also be employed.

The planar dielectric material layer can be subsequently patterned to form the plurality of fin-defining mask structures 60. In one embodiment, each fin-defining mask structure 60 can laterally extend along a lengthwise direction. Further, each fin-defining mask structure 60 can have a pair of sidewalls that are separated along a widthwise direction, which is perpendicular to the lengthwise direction. In one embodiment, each fin-defining mask structure 60 can have a rectangular horizontal cross-sectional area. In one embodiment, each fin-defining mask structures 60 can have the same fin width w.

Referring to FIGS. 2A and 2B, the semiconductor layer 30L is patterned to form a plurality of first semiconductor fins 30 in a first device region R1, and a plurality of second semiconductor fins 40 in a second device region R2. The formation of the plurality of first semiconductor fins 30 and the plurality of second semiconductor fins 40 can be performed employing an anisotropic etch process, which can be a reactive ion etch. Each of plurality of first semiconductor fins 30 and the plurality of second semiconductor fins 40 can have a substantially same horizontal cross-sectional shapes as an overlying fin-defining mask structure 42. As used herein, two shapes are "substantially same" if the differences between the two shapes is due to atomic level roughness and does not exceed 2 nm. The semiconductor layer 30L is etched employing the anisotropic etch process in which the plurality of fin-defining mask structures 42 is employed as an etch mask. The plurality of first semiconductor fins 30 and the plurality of second semiconductor fins 40 are formed on the insulator layer 20. In one embodiment, the plurality of first semiconductor fins 30 and the plurality of second semiconductor fins 40 can include a single crystalline semiconductor material, and may have the same fin width w.

The sidewalls of each first semiconductor fin 30 and each second semiconductor fin 40 can be vertically coincident with sidewalls of an overlying fin-defining mask structure 42. As used herein, a first surface and a second surface are vertically coincident if the first surface and the second surface are within a same vertical plane. In one embodiment, the height of the plurality of first semiconductor fins 30 and the plurality of second semiconductor fins 40 can be greater than the fin width w of the first and second semiconductor fins (30, 40).

In one embodiment, each neighboring pair of first semiconductor fins 30 can be laterally spaced from each other by a first spacing s1, and each neighboring pair of second semiconductor fins 40 can be laterally spaced from each other by a second spacing s2. In one embodiment, the first spacing s1 can be the same as the second spacing s2. In another embodiment, the first spacing s1 can be different from the second spacing s2. While the present disclosure is described employing an embodiment in which the first semiconductor fins 30 and the second semiconductor fins 40 have the same fin width w, the width of each first semiconductor fin 30 and the width of each second semiconductor fin 40 can be independently selected without regard to widths of other first semiconductor fins 30 or the widths of other second semiconductor fins 40. Further, the spacing between any neighboring pair of first semiconductor fins 30 or any neighboring pair of second semiconductor fins 40 can be independently selected without regard to spacings between any other neighboring pair of semiconductor fins (30, 40).

Each of the plurality of first semiconductor fins 30 and the plurality of second semiconductor fins 40 can have substantially vertical sidewalls. As used herein, a surface is "substantially vertical" if the difference between the surface and a vertical surface is due to atomic level roughness and does not exceed 2 nm. Each of the plurality of first semiconductor fins 30 and the second semiconductor fins 40 can be a single crystalline semiconductor fin that laterally extends along a lengthwise direction, which is a direction perpendicular to the first spacing s1 or the second spacing s2. As used herein, a "lengthwise direction" is a horizontal direction along which an object extends the most. A "widthwise direction" is a horizontal direction that is perpendicular to the lengthwise direction.

In one embodiment, each of the plurality of first semiconductor fins 30 and the plurality of second semiconductor fins 40 can extend along the lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction. The handle substrate 10 and the insulator layer 20 collectively functions as a substrate on which the plurality of first semiconductor fins 30 and the plurality of second semiconductor fins 40 are located. The substantially rectangular vertical cross-sectional shape adjoins a horizontal interface with a top surface of the combination of the insulator layer 20 and the handle substrate 10, i.e., the substrate (10, 20).

Each semiconductor fin (30, 40) has a first sidewall and a second sidewall that are parallel to each other and laterally spaced from each other by the width of the semiconductor fin, which can be, for example, the fin width w. In one embodiment, the first plurality of the first semiconductor fins 30 can include a plurality of parallel semiconductor fins having a pitch that is the same as the sum of the fin width w of the first semiconductor fins 30 and the first spacing s1, which is a lateral distance between the a neighboring pair of first semiconductor fins 30. Further, the second plurality of semiconductor fins 40 can include another plurality of parallel semiconductor fins having a pitch that is the same as the sum of the fin width w of the second semiconductor fins 40 and the second spacing s2, which is a lateral distance between the a neighboring pair of second semiconductor fins 40. In one embodiment, the first spacing s1 can be the same as the second spacing s2.

Referring to FIGS. 3A and 3B, the plurality of fin-defining mask structures 42 can be removed selective to the plurality of first semiconductor fins 30 and the plurality of second semiconductor fins 40 by an etch process. The etch can be an isotropic etch or an anisotropic etch. The etch process can be selective, or non-selective, to the dielectric material of the insulator layer 20. In one embodiment, the plurality of fin-defining mask structures 42 can be removed selective to the plurality of first semiconductor fins 30, the plurality of second semiconductor fins 40, and the insulator layer 20 employing a wet etch chemistry.

A gate stack including a gate dielectric (50A or 50B), a gate electrode (52A or 52B), and an optional gate cap dielectric (54A or 54B) can be formed in each of the first and second device regions (R1, R2). For example, a first gate stack including a first gate dielectric 50A, a first gate electrode 52A, and a first gate cap dielectric 54A can be formed across the plurality of first semiconductor fins 30 such that the first gate stack (50A, 52A, 54A) straddles each of the plurality of first semiconductor fins 30. A second gate stack including a first a second gate dielectric 50B, a second gate electrode 52B, and a second gate cap dielectric 54B can be formed across the plurality of second semiconductor fins 40 such that the second gate stack (50A, 52A, 54B) straddles each of the plurality of second semiconductor fins 40. Each gate dielectric (50A, 50B) can include a silicon-oxide-based dielectric material such as silicon oxide or silicon oxynitride, or silicon nitride, and/or a dielectric metal oxide having a dielectric constant greater than 8.0 and is known as a high dielectric constant (high-k) dielectric material in the art. The thickness of the gate dielectrics (50A, 50B) can be in a range from 1 nm to 10 nm, although lesser and greater thicknesses can also be employed. The first gate dielectric 50A can be in contact with a top surface and sidewall surfaces of each first semiconductor fin 30A. The second gate dielectric 50B can be in contact with a top surface and sidewall surfaces of each second semiconductor fin 30B. The gate electrodes (52A, 52B) can include a conductive material such as a doped semiconductor material, a metallic material, and/or a combination thereof. The gate electrodes (52A, 52B) can be in contact with the gate dielectrics (50A, 50B). The gate cap dielectrics (54A, 54B) can include a dielectric material such as silicon oxide, silicon nitride, silicon oxynitride, or a combination thereof.

The formation of the gate dielectrics (50A, 50B), the gate electrodes (52A, 52B), and the optional gate cap dielectrics (54A, 54B) can be effected, for example, by deposition of a stack of a gate dielectric layer, a gate electrode layer, and a gate cap dielectric layer, and by subsequent patterning of the gate cap dielectric layer, the gate electrode layer, and the gate dielectric layer. The patterning of the gate cap dielectric layer and the gate electrode layer can be performed employing a combination of lithographic methods and at least one anisotropic etch. The patterning of the gate dielectric layer can be performed by an isotropic etch that is selective to the first semiconductor material of the plurality of first semiconductor fins 30 and the plurality of second semiconductor fins 40.

A first gate spacer 56A can be formed around the first gate stack (50A, 52A, 54A), and a second gate spacer 56B can be formed around the second gate stack (50B, 52B, 54B). The gate spacers (56A, 56B) can be formed, for example, by depositing a conformal dielectric material layer on the plurality of first and second semiconductor fins (30, 40) and the gate stacks (50A, 52A, 54A, 50B, 52B, 54B), and anisotropically etching the conformal dielectric layer. The anisotropic etch includes an overetch component that removes vertical portions of the conformal dielectric material layer from the sidewalls of the plurality of first and second semiconductor fins (30, 40). An upper portion of the gate cap dielectrics (54A, 54B) can be vertically recessed during the overetch of the conformal dielectric material layer. The remaining portions of the conformal dielectric material layer constitute the first and second gate spacer (56A, 56B), which laterally surrounds the first gate stack (50A, 52A, 54A) and the second gate stack (50B, 52B, 54B).

Referring to FIGS. 4A and 4B, a masking layer 37 is formed such that the masking layer 37 covers the plurality of second semiconductor fins 40 within the second device region R2, while physically exposing the plurality of first semiconductor fins 30 within the first device region R1. The masking layer 37 can be, for example, a patterned photoresist layer.

A species of dopants is implanted into surface portions of each first semiconductor fin 30 in the first device region R1, while the masking layer 37 prevents implantation of the dopants into the plurality of second semiconductor fins 40. In one embodiment, the species of dopants can be implanted by angled implantation of dopant atoms into a first sidewall 31A of each first semiconductor fin 30, while implantation of dopants into a lower portion of the second sidewall 31B of each first semiconductor fin 30 is prevented by the masking layer 37. The species of dopants can be simultaneously implanted into each first semiconductor fin 30.

A contiguous surface portion of each first semiconductor fin 30 is converted into an implanted surface region 34, which includes the first semiconductor material of the plurality of the first semiconductor fins 30 prior to the angled ion implantation. Each implanted surface region 34 can be formed directly underneath the first sidewall 31A within each first semiconductor fin 30, and directly underneath a top surface of each first semiconductor fin 30. Each implanted surface region 34 can be formed as a contiguous region. As used herein, an element is "contiguous" if there exists a path contained entirely within the element for any pair of points within the element. Within each first semiconductor fin 30, the implanted surface region 34 can have an upper portion having the same width as the first semiconductor fin 30 and a lower portion having a width that is less than the width of the first semiconductor fin 30. Within each first semiconductor fin 30, the portion of each second sidewall 31B that is vertically spaced farther than the thickness of an upper portion of an implanted surface region 34 from the top surface of the first semiconductor fin 30 does not contact the implanted surface region 34.

Each first semiconductor fin 30 includes an implanted surface region 34 and an unimplanted bulk region 32 that does not include the species of dopants that are implanted by the angled ion implantation.

In one embodiment, the first semiconductor fins 30 can be single crystalline prior to the implantation of the species of dopants, and the species of dopants can introduce structural damage to the crystallographic structure of the first semiconductor fins 30. In this case, the species of dopants can be a non-electrical dopant, i.e., a dopant that does not introduce any extra electrical charge to the first semiconductor fins 30. In one embodiment, the species of dopants can be an element selected from C, F, Ar, and Xe.

In another embodiment, the first semiconductor fins 30 can be an element that retards deposition of a second semiconductor material during a subsequent deposition process for deposition of the second semiconductor material. In this case, the species of dopants can be an n-type electrical dopant selected from P, As, and Sb.

The masking layer 37 is subsequently removed. If the masking layer 37 is a patterned photoresist layer, the masking layer 37 can be removed by ashing.

Referring to FIGS. 5A and 5B, a second semiconductor material is deposited on the plurality of first semiconductor fins 30 and the plurality of second semiconductor fins 40. In one embodiment, the second semiconductor material can be deposited by a selective deposition method that deposits the second semiconductor material only on semiconductor surfaces, and does not deposit the semiconductor material on dielectric surfaces such as the top surface of the insulator layer 20. In one embodiment, the first and second semiconductor fins (30, 40) can be single crystalline, and the second semiconductor material can be deposited by a selective epitaxy process that deposits the second semiconductor material with epitaxial alignment with the crystal structure of the first semiconductor material in the first and second semiconductor fins (30, 40).

Within the first device region R1, the second semiconductor material is deposited on each first sidewall 31A, each second sidewall 31B, and other physically exposed surfaces of the plurality of first semiconductor fins 30. The second semiconductor material is deposited with different growth rates between the first and second sidewalls (31A, 31B) due to presence or absence of the species of dopants at the first and second sidewalls (31A, 31B). Specifically, the growth rate of the second semiconductor material on the first sidewalls 31A is less than the growth rate of the second semiconductor material on the second sidewalls 31B of the plurality of first semiconductor fins 30. The difference in the growth rates of the second semiconductor material can be due to the structural damage that the species of dopants introduce in the implanted surface regions 34, or due to the retardation of the growth rate of the second semiconductor material on the surfaces of the implanted surface regions 34. Thus, the deposited second semiconductor material has an asymmetric vertical cross-sectional shape along a vertical plane perpendicular to the first and second sidewalls (31A, 31B).

Within the second device region R2, the second semiconductor material is deposited on physically exposed surfaces of the plurality of second semiconductor fins 40 concurrently with the deposition of the second semiconductor material on physically exposed surfaces of the plurality of first semiconductor fins 30. The second semiconductor material can be deposited with the same growth rate at all sidewalls of the plurality of second semiconductor fins 40 that are perpendicular to the lengthwise direction of the second gate electrode 52B. The sidewalls of the plurality of second semiconductor fins 40 that are perpendicular to the lengthwise direction of the second gate electrode 52B can have the same surface orientations, and do not include the species of dopants contained within the implanted surface regions 34. The deposition rate of the second semiconductor material on the plurality of second semiconductor fins 40 can be the same as the deposition rate of the second semiconductor material on the portions of the plurality of first semiconductor fins 30 that do not include any dopants implanted during the processing steps of FIGS. 4A and 4B.

The portions of the second semiconductor material deposited on the plurality of first semiconductor fins 30 constitutes various raised semiconductor regions, which include first raised source regions 76S and first raised drain regions 76D. The portions of the second semiconductor material deposited on the plurality of second semiconductor fins 40 constitute a second raised source region 86S and a second raised drain region 86D. The duration of the selective epitaxy process can be selected such that portions of the deposited second semiconductor material on each neighboring pair of first semiconductor fins 30 do not merge with each other upon termination of deposition of the second semiconductor material, while portions of the deposited second semiconductor material on each neighboring pair of second semiconductor fins 40 merge with each other upon termination of deposition of the second semiconductor material. In the first device region R1, a plurality of first raised source region 76S and a plurality of first raised drain region 76D are formed on the plurality of first semiconductor fins 30, which are parallel among one another.

The number of the first raised source region 36, the number of the first raised drain region 76D, and the number of the first semiconductor fins 30 can be the same. Each first raised source region 76S does not contact any other first raised source region 76S, and each first raised drain region 76D does not contact any other first raised drain region 76D. In contrast, in the second device region R2, two merged semiconductor material portions including the second semiconductor material in contact with the plurality of second semiconductor fins 40, which are parallel among one another, is formed.

Various raised active regions (76S, 76D, 86S, 86D) and various active regions (72, 74, 80) are formed. As used herein, a raised active region refers to a doped semiconductor material portion that protrudes above a topmost surface of an active region of a semiconductor device. As used herein, an active region refers to a semiconductor material portion within a semiconductor device through which charge carriers flow during operation of the semiconductor device. The raised active regions (76S, 76D, 86S, 86D) include first raised source regions 76S, first raised drain regions 76D, a second raised source region 86S, and a second raised drain region 86D. The first raised source regions 76S and the first raised drain regions 76D are herein collectively referred to as first raised active regions (76S, 76D), and the second raised source region 86S and the second raised drain region 86D are herein collectively referred to as second raised active regions (86S, 86D).

The raised active regions (76S, 76D, 86S, 86D) can be formed by introducing electrical dopants into the first raised source regions 76S, the first raised drain regions 76D, the second raised source region 86S, and the second raised drain region 86D by in-situ doping of the deposited second semiconductor material during formation of the first raised source regions 76S, the first raised drain regions 76D, the second raised source region 86S, and the second raised drain region 86D, or by ex-situ doping of the deposited second semiconductor material by ion implantation or by plasma doping after formation of the first raised source regions 76S, the first raised drain regions 76D, the second raised source region 86S, and the second raised drain region 86D.

The active regions (72, 74, 80) can be formed by introducing electrical dopants into the portions of first and second semiconductor fins (30, 40; See FIGS. 5A and 5B) that underlie the raised active regions (76S, 76D, 86S, 86D) by ion implantation, or can be formed by inducing outdiffusion of the electrical dopants that are present within the raised active regions (76S, 76D, 86S, 86D) by an anneal at an elevated temperature, which can be, for example, in a range from 600 degrees Celsius to 1,000 degrees Celsius.

Each subset (72, 74) of the active regions (72, 74, 80) that underlies each first raised source region 76S constitutes a first source region, and each subset (72, 74) of the active regions (72, 74, 80) that underlies each first raised drain regions 76D constitutes a first drain region. The first source regions and the first drain regions are collectively referred to as first active regions (72, 74). Each first active region (72, 74) includes a cuboid active region 72 and a dopant-including surface region 74. The cuboid active region 72 includes electrical dopants (p-type dopants or n-type dopants) introduced by ion implantation or by outdiffusion from the first raised source regions 76S or the first raised drain regions 76D. The dopant-including surface region 74 includes the electrical dopants in the cuboid active region 72 at the same concentration as the cuboid active region 72 and additionally includes the species of dopants introduced by angled ion implantation at the processing steps of FIGS. 4A and 4B. As used herein, a cuboid refers to a rectangular parallelepiped.

Each subset 80 of the active regions (72, 74, 80) that underlies each second raised source region 86S constitutes a second source region, and each subset 80 of the active regions (72, 74, 80) that underlies each second raised drain region 86D constitutes a second drain region. The second source region and the second drain region are collectively referred to as second active regions 80. Each second active region 80 includes electrical dopants (p-type dopants or n-type dopants) introduced by ion implantation or by outdiffusion from the second raised source regions 86S or the second raised drain regions 86D.

Referring to FIGS. 6A-6C, a contact level dielectric layer 90 is formed over the gate stacks (50A, 52A, 54A, 50B, 52B, 54B) and the various raised active regions (76S, 76D, 86S, 86D). The contact level dielectric material layer 90 includes a dielectric material such as silicon oxide, silicon nitride, and/or porous or non-porous organosilicate glass (OGS). The contact level dielectric material layer 90 can be formed, for example, by chemical vapor deposition or spin coating. Optionally, the top surface of the contact level dielectric material layer 90 can be planarized, for example, by chemical mechanical planarization.

Various contact via structures (94A, 94B, 96A, 96B, 98A, 98B) are formed through the contact level dielectric layer 90. The various contact via structures (94A, 94B, 96A, 96B, 98A, 98B) can include a plurality of first source-side contact via structures 94A that provides electrical contact to the first raised source region 76S, a plurality of first drain-side contact via structures 96A that provides electrical contact to the first raised drain region 76D, at least one first gate-side contact via structure 98A that provides electrical contact to the first gate electrode 52A, at least one second source-side contact via structure 94B that provides electrical contact to the second raised source region 86S, at least one second drain-side contact via structure 96B that provides electrical contact to the second raised drain region 86D, and at least one second gate-side contact via structure 98B that provides electrical contact to the second gate electrode 52B. First metal semiconductor alloy regions 92A can be formed between each of the first raised source regions 76S and the first raised drain regions 76D and an overlying contact via structure, which can be a first source-side contact via structure 94A or a first drain-side contact via structure 94B. Second metal semiconductor alloy regions 92B can be formed between the second raised source region 86S and the second source-side contact via structure 94B and between the second raised drain region 86D and the second drain-side contact via structure 96B.

Each portion of the first semiconductor fins (30; See FIGS. 4B and 5B) that are not doped with dopants at the processing steps of FIGS. 4A and 4B and FIGS. 5A and 5B constitutes a first body region 3B, which functions as a channel of the first field effect transistor including the first gate electrode 52A. Each portion of the second semiconductor fins (40; See FIGS. 4B and 5B) that are not doped with dopants at the processing steps of FIGS. 4A and 4B and FIGS. 5A and 5B constitutes a second body region 4B, which functions as a channel of a second field effect transistor including the second gate electrode 52B.

The first exemplary semiconductor structure includes a first semiconductor fin (72, 74, 3B) located on a substrate (10, 20) and having a first sidewall contained within a first vertical plane VP1 and a second sidewall contained within a second vertical plane VP2 that is parallel to the first vertical plane, and a first raised active region (76S or 76D) including a semiconductor material and having an asymmetric vertical cross-sectional shape along a vertical plane perpendicular to the first and second vertical planes (VP1, VP2). The asymmetric vertical cross-sectional shape includes a first region 761 located on an opposite side of the semiconductor fin with respect to the first vertical plane VP1, and a second region 762 located on an opposite side of the semiconductor fin with respect to the second vertical plane VP2. The first region 761 has a greater maximum lateral extent than the second region 762.

In one embodiment, the first region 761 has a shape that includes a corner at which a pair of non-horizontal and non-vertical faceted surfaces of the first raised active region (76S or 76D) is joined. In one embodiment, the second region 762 has a shape that includes a side that is parallel to the second vertical plane VP2.

Each first semiconductor fin (72, 74, 3B) can include a dopant-including surface region 74 that includes a species of dopants and contacting a second sidewall contained within a second vertical plane VP2. Each dopant-including surface region 74 can have an upper portion having a same fin width w as the semiconductor fin (72, 74, 3B) and a lower portion having a width that is less than the same fin width w. In one embodiment, each first semiconductor fin (72, 74, 3B) can further include a cuboid active region 72 in contact with a dopant-including surface region 74 and not including the species of dopants. A first gate stack (50A, 52A, 54A) straddles the first semiconductor fin (72, 74, 3B), the first gate stack (50A, 52A, 54A) includes a first gate dielectric 50A and a first gate electrode 52A.

In one embodiment, the first semiconductor fins (72, 74, 3B) can constitute a periodic structure in the first device region R1, and the first semiconductor fins (72, 74, 3B) can constitute a plurality of parallel semiconductor fin having a pitch that is the same as the sum of the width of the first semiconductor fins (72, 74, 3B) (which can be w as illustrated in FIG. 2B) and the lateral distance between neighboring pairs of first semiconductor fins (72, 74, 3B), which can be the same as the first spacing s1 (See FIG. 2B). In one embodiment, the second semiconductor fins (80, 4B) can constitute a periodic structure in the second device region R2, and the second semiconductor fins (80, 4B) can constitute a plurality of parallel semiconductor fins having a pitch that is the same as the sum of the width of the second semiconductor fins (80, 4B) (which can be w as illustrated in FIG. 2B) and a lateral distance between neighboring pairs of second semiconductor fins (80, 4B). In one embodiment, the pitch of the first semiconductor fins (72, 74, 3B) can be the same as the pitch of the second semiconductor fins (80, 4B).

In the first device region R1, each raised active region (76S, 76D) is laterally spaced from neighboring raised active regions (76S, 76D). First raised active regions (76S, 76D) of neighboring first semiconductor fins (72, 74, 3B) do not contact each other, and are laterally spaced from each other by a distance less than a lateral extent of the asymmetric vertical cross-sectional shape, which is the sum of the a first width w1, the fin width w (See FIG. 2B) of a first semiconductor fin (72, 74, 3B), and the second width w2. The first width w1 is the width of a first region 761, ad the second width w2 is the width of a second region 762.

In the second device region R2, each of the second raised active regions (86S, 86D) constitute a merged raised active region including the semiconductor material as the semiconductor material of the first raised active regions (76S, 76D) and in contact with the plurality of parallel second semiconductor fins.

In the first device region R1, each first region 761 is located on the first sidewall within a first vertical plane VP1 of a first semiconductor fin (72, 74, 3B) and each second region 762 is located on the second sidewall within a second vertical plane VP2 of the first semiconductor fin (72, 74, 3B). Each first region 761 includes all portions of a first raised active region (765 or 76D) that are more distal from the center of mass of the first semiconductor fin (72, 74, 3B) in contact with the first region 761 than the first vertical plane VP1. Each second region 762 includes all portions of the first raised active region (76S or 76D) that are more distal from the center of mass of the first semiconductor fin (72, 74, 3B) than the second vertical plane VP2.

Referring to FIGS. 7A and 7B, a second exemplary semiconductor structure according to a second embodiment of the present disclosure is derived from the first exemplary semiconductor structure of FIGS. 3A and 3B by performing a first angled ion implantation. The first angled ion implantation can be performed without employing a masking layer. A species of dopants can be implanted into surface portions of each first semiconductor fin 30 in the first device region R1 and each second semiconductor fin 40 in the second device region R2. The species of dopants can be simultaneously implanted into each first semiconductor fin 30 and each second semiconductor fin 40.

A contiguous surface portion of each first semiconductor fin 30 is converted into a first implanted surface region 34', which includes the first semiconductor material of the plurality of the first semiconductor fins 30 prior to the angled ion implantation. A contiguous surface portion of each second semiconductor fin 40 is converted into a second implanted surface region 44, which includes the first semiconductor material of the plurality of the second semiconductor fins 40 prior to the angled ion implantation. Each implanted surface region (34', 44) can be formed directly underneath a sidewall of each semiconductor fin (30, 40), and directly underneath a top surface of each semiconductor fin (30, 40). Each implanted surface region (34', 44) can be formed as a contiguous region. Within each semiconductor fin (30, 40), the implanted surface region 34 can have an upper portion having the same width as the semiconductor fin (30 or 40) and a lower portion having a width that is less than the width of the semiconductor fin (30 or 40). Within each semiconductor fin (30 or 40), a portion of a sidewall that is vertically spaced farther than the thickness of an upper portion of an implanted surface region (34', 44) from the top surface of the semiconductor fin (30 or 40) does not contact the implanted surface region (34', 44).

Each first semiconductor fin 30 includes a first implanted surface region 34' and a first unimplanted bulk region 32' that does not include the species of dopants that are implanted by the angled ion implantation. Each second semiconductor fin 40 includes a second implanted surface region 44 and a second unimplanted bulk region 42 that does not include the species of dopants that are implanted by the angled ion implantation.

In one embodiment, the species of dopants can be selected as an element or a compound of an element that accelerates deposition of a semiconductor material on the surfaces of the semiconductor fins (30, 40) during a subsequent semiconductor material deposition process. In one embodiment, the species of dopants can be boron or $BF_2$.

Referring to FIGS. 8A and 8B, a masking layer 137 is formed such that the masking layer q37 covers the plurality of first semiconductor fins 30 within the first device region R1, while physically exposing the plurality of second semiconductor fins 40 within the second device region R2. The masking layer 137 can be, for example, a patterned photoresist layer.

The same species of dopants as the dopants employed at the processing steps of FIGS. 8A and 8B can be implanted into surface portions of each second semiconductor fin 40 in the second device region R2, while the masking layer 137 prevents implantation of the dopants into the plurality of first semiconductor fins 30. The species of dopants can be implanted by angled implantation of dopant atoms into all sidewalls of the second semiconductor fins 40.

Each second implanted surface region 44 is extended such that each second implanted surface region 44 includes two vertical portions underlying sidewalls of a second semiconductor fin 40 and a horizontal portion underlying the top surface of the second semiconductor fin 40. The two vertical portions of each second implanted surface region 44 can contact the top surface of the insulator layer 20. The horizontal portions of each second implanted surface region 44 adjoin the two vertical portions of the second implanted surface region 44. In one embodiment, all sidewall surfaces and top surfaces of the second semiconductor fins 40 can be surfaces of the second implanted surface regions 44.

The masking layer 137 is subsequently removed. If the masking layer 137 is a patterned photoresist layer, the masking layer 37 can be removed by ashing.

Referring to FIGS. 9A and 9B, the processing steps of FIGS. 5A and 5B can be performed. Specifically, a second semiconductor material is deposited on the plurality of first semiconductor fins 30 and the plurality of second semiconductor fins 40. In one embodiment, the second semiconductor material can be deposited by a selective deposition method that deposits the second semiconductor material only on semiconductor surfaces, and does not deposit the semiconductor material on dielectric surfaces such as the top surface of the insulator layer 20. In one embodiment, the first and second semiconductor fins (30, 40) can be single crystalline, and the second semiconductor material can be deposited by a selective epitaxy process that deposits the second semiconductor material with epitaxial alignment with the crystal structure of the first semiconductor material in the first and second semiconductor fins (30, 40).

Because of the species of dopants within the first and second implanted surface regions (34', 44) accelerate the deposition of the second semiconductor material, the second semiconductor material is deposited with different growth rates between surfaces including the species of dopants and surfaces that do not include the species of dopants. Specifically, the growth rate of the second semiconductor material on the surfaces of the first and second implanted surface regions (34', 44) is greater than the growth rate of the second semiconductor material on the surfaces of the first unimplanted bulk region 32'. Thus, the deposited second semiconductor material has an asymmetric vertical cross-sectional shape along a vertical plane perpendicular to the sidewalls of each semiconductor fin (30, 40).

Within the second device region R2, the second semiconductor material is deposited on physically exposed surfaces of the plurality of second semiconductor fins 40 concurrently with the deposition of the second semiconductor material on physically exposed surfaces of the plurality of first semiconductor fins 30. The second semiconductor material can be deposited with the same growth rate at all sidewalls of the plurality of second semiconductor fins 40 that are perpendicular to the lengthwise direction of the second gate electrode 52B. The sidewalls of the plurality of second semiconductor fins 40 that are perpendicular to the lengthwise direction of the second gate electrode 52B can have the same surface orientations, and include the same species of dopants contained within the first implanted surface regions 34'. The deposition rate of the second semiconductor material on the plurality of second semiconductor fins 40 can be the same as the deposition rate of the second semiconductor material on the portions of the plurality of first semiconductor fins 30 that include the dopants implanted during the processing steps of FIGS. 8A and 8B.

The portions of the second semiconductor material deposited on the plurality of first semiconductor fins 30 constitutes various raised semiconductor regions, which include first raised source regions 76S and first raised drain regions 76D. The portions of the second semiconductor material deposited on the plurality of second semiconductor fins 40 constitute a second raised source region 86S and a second raised drain region 86D. The duration of the selective epitaxy process can be selected such that portions of the deposited second semiconductor material on each neighboring pair of first semiconductor fins 30 do not merge with each other upon termination of deposition of the second semiconductor material, while portions of the deposited second semiconductor material on each neighboring pair of second semiconductor fins 40 merge with each other upon termination of deposition of the second semiconductor material. In the first device region R1, a plurality of first raised source region 76S and a plurality of first raised drain region 76D are formed on the plurality of first semiconductor fins 30, which are parallel among one another. The number of the first raised source region 36, the number of the first raised drain region 76D, and the number of the first semiconductor fins 30 can be the same. Each first raised source region 76S does not contact any other first raised source region 76S, and each first raised drain region 76D does not contact any other first raised drain region 76D. In contrast, in the second device region R2, two merged semiconductor material portions including the second semiconductor material in contact with the plurality of second semiconductor fins 40, which are parallel among one another, is formed.

Various raised active regions (76S, 76D, 86S, 86D) and various active regions (72, 74, 80) are formed. The raised active regions (76S, 76D, 86S, 86D) include first raised source regions 76S, first raised drain regions 76D, a second raised source region 86S, and a second raised drain region 86D. The first raised source regions 76S and the first raised drain regions 76D are herein collectively referred to as first raised active regions (76S, 76D), and the second raised source region 86S and the second raised drain region 86D are herein collectively referred to as second raised active regions (86S, 86D).

The raised active regions (76S, 76D, 86S, 86D) can be formed by introducing electrical dopants into the first raised source regions 76S, the first raised drain regions 76D, the second raised source region 86S, and the second raised drain region 86D by in-situ doping of the deposited second semiconductor material during formation of the first raised source regions 76S, the first raised drain regions 76D, the second raised source region 86S, and the second raised drain region 86D, or by ex-situ doping of the deposited second semiconductor material by ion implantation or by plasma doping after formation of the first raised source regions 76S, the first raised drain regions 76D, the second raised source region 86S, and the second raised drain region 86D.

The active regions (72, 74, 80) can be formed by introducing electrical dopants into the portions of first and second semiconductor fins (30, 40; See FIGS. 5A and 5B) that underlie the raised active regions (76S, 76D, 86S, 86D) by ion implantation, or can be formed by inducing outdiffusion of the electrical dopants that are present within the raised active regions (76S, 76D, 86S, 86D) by an anneal at an elevated temperature, which can be, for example, in a range from 600 degrees Celsius to 1,000 degrees Celsius.

Each subset (72, 74) of the active regions (72, 74, 80) that underlies each first raised source region 76S constitutes a first source region, and each subset (72, 74) of the active regions (72, 74, 80) that underlies each first raised drain regions 76D constitutes a first drain region. The first source regions and the first drain regions are collectively referred to as first active regions (72, 74). Each first active region (72, 74) includes a cuboid active region 72 and a dopant-including surface region 74. The cuboid active region 72 includes electrical dopants (p-type dopants or n-type dopants) introduced by ion implantation or by outdiffusion from the first raised source regions 76S or the first raised drain regions 76D. The dopant-including surface region 74 includes the electrical dopants in the cuboid active region 72 at the same concentration as the cuboid active region 72 and additionally includes the species of dopants introduced by angled ion implantation at the processing steps of FIGS. 7A and 7B.

Each subset 80 of the active regions (72, 74, 80) that underlies each second raised source region 86S constitutes a second source region, and each subset 80 of the active regions (72, 74, 80) that underlies each second raised drain region 86D constitutes a second drain region. The second source region and the second drain region are collectively referred to as second active regions 80. Each second active region 80 includes a cuboid active region 82 and a dopant-including surface region 84. The cuboid active region 82 includes electrical dopants (p-type dopants or n-type dopants) introduced by ion implantation or by outdiffusion from the second raised source regions 86S or the second raised drain regions 86D. The dopant-including surface region 84 includes the electrical dopants in the cuboid active region 82 at the same concentration as the cuboid active region 82 and additionally includes the species of dopants introduced by angled ion implantation at the processing steps of FIGS. 7A, 7B, 8A, and 8B.

Figure 10A:
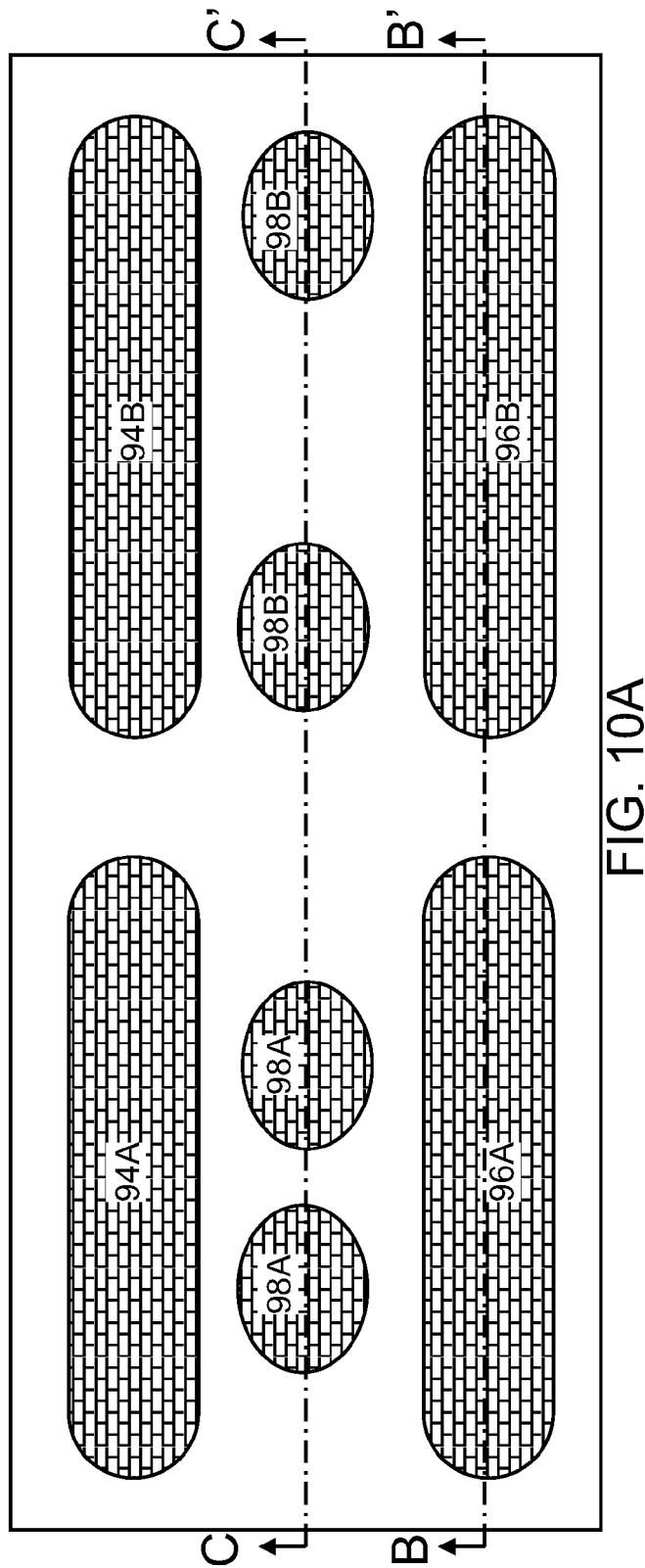
FIG. 10A is a top-down view of the second exemplary semiconductor structure after formation of various raised active regions, a contact level dielectric layer, and various contact via structures according to the second embodiment of the present disclosure.

Referring to FIGS. 10A-10C, the processing steps of FIGS. 6A-6C can be performed. a contact level dielectric layer 90 is formed over the gate stacks (50A, 52A, 54A, 50B, 52B, 54B) and the various raised active regions (76S, 76D, 86S, 86D). The contact level dielectric material layer 90 includes a dielectric material such as silicon oxide, silicon nitride, and/ or porous or non-porous organosilicate glass (OGS). The contact level dielectric material layer 90 can be formed, for example, by chemical vapor deposition or spin coating. Optionally, the top surface of the contact level dielectric material layer 90 can be planarized, for example, by chemical mechanical planarization.

Various contact via structures (94A, 94B, 96A, 96B, 98A, 98B) are formed through the contact level dielectric layer 90. The various contact via structures (94A, 94B, 96A, 96B, 98A, 98B) can include a plurality of first source-side contact via structures 94A that provides electrical contact to the first raised source region 76S, a plurality of first drain-side contact via structures 96A that provides electrical contact to the first raised drain region 76D, at least one first gate-side contact via structure 98A that provides electrical contact to the first gate electrode 52A, at least one second source-side contact via structure 94B that provides electrical contact to the second raised source region 86S, at least one second drain-side contact via structure 96B that provides electrical contact to the second raised drain region 86D, and at least one second gate-side contact via structure 98B that provides electrical contact to the second gate electrode 52B. First metal semiconductor alloy regions 92A can be formed between each of the first raised source regions 76S and the first raised drain regions 76D and an overlying contact via structure, which can be a first source-side contact via structure 94A or a first drain-side contact via structure 94B. Second metal semiconductor alloy regions 92B can be formed between the second raised source region 86S and the second source-side contact via structure 94B and between the second raised drain region 86D and the second drain-side contact via structure 96B.

Each portion of the first semiconductor fins 30 that are not doped with dopants at the processing steps of FIGS. 7A, 7B, 8A, 8B, 9A, and 9B constitutes a first body region 3B, which functions as a channel of the first field effect transistor including the first gate electrode 52A. Each portion of the second semiconductor fins (40; See FIGS. 4B and 5B) that are not doped with dopants at the processing steps of FIGS. 7A, 7B, 8A, 8B, 9A, and 9B constitutes a second body region 4B, which functions as a channel of a second field effect transistor including the second gate electrode 52B.

The second exemplary semiconductor structure includes a first semiconductor fin (72, 74, 3B) located on a substrate (10, 20) and having a first sidewall contained within a first vertical plane VP1 and a second sidewall contained within a second vertical plane VP2 that is parallel to the first vertical plane, and a first raised active region (76S or 76D) including a semiconductor material and having an asymmetric vertical cross-sectional shape along a vertical plane perpendicular to the first and second vertical planes (VP1, VP2). The asymmetric vertical cross-sectional shape includes a first region 761 located on an opposite side of the semiconductor fin with respect to the first vertical plane VP1, and a second region 762 located on an opposite side of the semiconductor fin with respect to the second vertical plane VP2. The first region 761 has a greater maximum lateral extent than the second region 762.

In one embodiment, the first region 761 has a shape that includes a corner at which a pair of non-horizontal and non-vertical faceted surfaces of the first raised active region (76S or 76D) is joined. In one embodiment, the second region 762 has a shape that includes a side that is parallel to the second vertical plane VP2.

Each first semiconductor fin (72, 74, 3B) can include a dopant-including surface region 74 that includes a species of dopants and contacting a first sidewall contained within a first vertical plane VP1. Each dopant-including surface region 74 can have an upper portion having a same fin width w as the semiconductor fin (72, 74, 3B) and a lower portion having a width that is less than the same fin width w. In one embodiment, each first semiconductor fin (72, 74, 3B) can further include a cuboid active region 72 in contact with a dopant-including surface region 74 and not including the species of dopants. A first gate stack (50A, 52A, 54A) straddles the first semiconductor fin (72, 74, 3B), the first gate stack (50A, 52A, 54A) includes a first gate dielectric 50A and a first gate electrode 52A.

In one embodiment, the first semiconductor fins (72, 74, 3B) can constitute a periodic structure in the first device region R1, and the first semiconductor fins (72, 74, 3B) can constitute a plurality of parallel semiconductor fin having a pitch that is the same as the sum of the width of the first semiconductor fins (72, 74, 3B) (which can be w as illustrated in FIG. 2B) and the lateral distance between neighboring pairs of first semiconductor fins (72, 74, 3B), which can be the same as the first spacing s1 (See FIG. 2B). In one embodiment, the second semiconductor fins (80, 4B) can constitute a periodic structure in the second device region R2, and the second semiconductor fins (80, 4B) can constitute a plurality of parallel semiconductor fins having a pitch that is the same as the sum of the width of the second semiconductor fins (80, 4B) (which can be w as illustrated in FIG. 2B) and a lateral distance between neighboring pairs of second semiconductor fins (80, 4B). In one embodiment, the pitch of the first semiconductor fins (72, 74, 3B) can be the same as the pitch of the second semiconductor fins (80, 4B).

In the first device region R1, each first raised active region (76S, 76D) is laterally spaced from neighboring raised active regions (76S, 76D). First raised active regions (76S, 76D) of neighboring first semiconductor fins (72, 74, 3B) do not contact each other, and are laterally spaced from each other by a distance less than a lateral extent of the asymmetric vertical cross-sectional shape, which is the sum of the a first width w1, the fin width w (See FIG. 2B) of a first semiconductor fin (72, 74, 3B), and the second width w2. The first width w1 is the width of a first region 761, ad the second width w2 is the width of a second region 762.

In the second device region R2, each of the second raised active regions (86S, 86D) constitute a merged raised active region including the semiconductor material as the semiconductor material of the first raised active regions (76S, 76D) and in contact with the plurality of parallel second semiconductor fins.

In the first device region R1, each first region 761 is located on the first sidewall within a first vertical plane VP1 of a first semiconductor fin (72, 74, 3B) and each second region 762 is located on the second sidewall within a second vertical plane VP2 of the first semiconductor fin (72, 74, 3B). Each first region 761 includes all portions of a first raised active region (76S or 76D) that are more distal from the center of mass of the first semiconductor fin (72, 74, 3B) in contact with the first region 761 than the first vertical plane VP1. Each second region 762 includes all portions of the first raised active region (76S or 76D) that are more distal from the center of mass of the first semiconductor fin (72, 74, 3B) than the second vertical plane VP2.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor fin located on a substrate and having a first sidewall contained within a first vertical plane and a second sidewall contained within a second vertical plane that is parallel to said first vertical plane, wherein a dopant-including surface region including a species of dopants is located within said semiconductor fin, and contacting one of said first sidewall and said second sidewall; and
   a raised active region comprising a semiconductor material and having an asymmetric vertical cross-sectional shape along a vertical plane perpendicular to said first and second vertical planes.

2. The semiconductor structure of claim 1, wherein said asymmetric vertical cross-sectional shape includes a first region located on an opposite side of said semiconductor fin with respect to said first vertical plane, and a second region located on an opposite side of said semiconductor fin with respect to said second vertical plane, wherein said first region has a greater maximum lateral extent than said second region.

3. The semiconductor structure of claim 1, wherein said first region has a shape that includes a corner at which a pair of non-horizontal and non-vertical faceted surfaces of said raised active region is joined.

4. The semiconductor structure of claim 3, wherein said second region has a shape that includes a side that is parallel to said second vertical plane.

5. A semiconductor structure comprising:
   a semiconductor fin located on a substrate and having a first sidewall contained within a first vertical plane and a second sidewall contained within a second vertical plane that is parallel to said first vertical plane; and
   a raised active region comprising a semiconductor material and having an asymmetric vertical cross-sectional shape along a vertical plane perpendicular to said first and second vertical planes, wherein said asymmetric vertical cross-sectional shape includes a first region located on an opposite side of said semiconductor fin with respect to said first vertical plane, and a second region located on an opposite side of said semiconductor fin with respect to said second vertical plane, wherein said first region has a greater maximum lateral extent than said second region, and wherein said first region has a shape that includes a corner at which a pair of non-horizontal and non-vertical faceted surfaces of said raised active region is joined.

6. The semiconductor structure of claim 1, wherein said dopant-including surface region has an upper portion having a same width as said semiconductor fin and a lower portion having a width that is less than said same width.

7. The semiconductor structure of claim 1, wherein said semiconductor fin includes a cuboid active region in contact with said dopant-including surface region and not including said species of dopants.

8. The semiconductor structure of claim 1, further comprising a gate stack straddling said semiconductor fin, said gate stack comprising a gate dielectric and a gate electrode.

9. The semiconductor structure of claim 1, further comprising:
   another semiconductor fin located on said substrate and having sidewalls that are parallel to said first and second vertical planes; and
   another raised active region comprising said semiconductor material and having another asymmetric vertical cross-sectional shape along said vertical plane perpendicular to said first and second vertical planes that is congruent to said asymmetric vertical cross-sectional shape,
   wherein said raised active region and said another raised active region are laterally spaced from each other by a distance less than a lateral extent of said asymmetric vertical cross-sectional shape.

10. The semiconductor structure of claim 9, further comprising:
    a plurality of parallel semiconductor fins having a pitch that is the same as a sum of a width of said semiconductor fin and a lateral distance between said semiconductor fin and said another semiconductor fin; and
    a merged raised active region comprising said semiconductor material and in contact with said plurality of parallel semiconductor fins.

11. The semiconductor structure of claim 5, further comprising a dopant-including surface region including a species of dopants located within said semiconductor fin, and contacting one of said first sidewall and said second sidewall.

12. A semiconductor structure comprising:
    a semiconductor fin located on a substrate and having a first sidewall contained within a first vertical plane and a second sidewall contained within a second vertical plane that is parallel to said first vertical plane;

a raised active region comprising a semiconductor material and having an asymmetric vertical cross-sectional shape along a vertical plane perpendicular to said first and second vertical planes;
another semiconductor fin located on said substrate and having sidewalls that are parallel to said first and second vertical planes; and
another raised active region comprising said semiconductor material and having another asymmetric vertical cross-sectional shape along said vertical plane perpendicular to said first and second vertical planes that is congruent to said asymmetric vertical cross-sectional shape, wherein said raised active region and said another raised active region are laterally spaced from each other by a distance less than a lateral extent of said asymmetric vertical cross-sectional shape.

* * * * *